United States Patent
Konigsburg et al.

(10) Patent No.: US 9,779,803 B1
(45) Date of Patent: Oct. 3, 2017

(54) MEMORY CIRCUIT WITH WRITE-BYPASS PORTION

(71) Applicants: Brian Konigsburg, Pasadena, CA (US); Paul Keaton Tschirhart, Crofton, MD (US)

(72) Inventors: Brian Konigsburg, Pasadena, CA (US); Paul Keaton Tschirhart, Crofton, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/446,812

(22) Filed: Mar. 1, 2017

(51) Int. Cl.
*G11C 11/44* (2006.01)
*H03K 19/195* (2006.01)
*H01L 39/22* (2006.01)

(52) U.S. Cl.
CPC ............ *G11C 11/44* (2013.01); *H01L 39/223* (2013.01); *H03K 19/1952* (2013.01)

(58) Field of Classification Search
None
See application file for complete search history.

(56) References Cited

U.S. PATENT DOCUMENTS

| | | | | | |
|---|---|---|---|---|---|
| 6,078,517 | A | * | 6/2000 | Herr | G11C 11/44 365/160 |
| 6,242,939 | B1 | * | 6/2001 | Nagasawa | G11C 11/44 326/3 |
| 6,836,141 | B2 | * | 12/2004 | Herr | G11C 11/44 326/1 |
| 7,505,310 | B2 | * | 3/2009 | Nagasawa | G11C 11/44 365/160 |
| 9,443,576 | B1 | * | 9/2016 | Miller | G11C 11/44 |
| 9,646,682 | B1 | * | 5/2017 | Miller | G11C 11/44 |

\* cited by examiner

*Primary Examiner* — Son Mai
(74) *Attorney, Agent, or Firm* — Tarolli, Sunheim, Covell & Tummino LLP

(57) ABSTRACT

One example includes a memory circuit. The memory circuit includes a memory array in which contiguous rows of the memory array are organized as a write-bypass portion that comprises a first portion of the rows and a main memory portion that includes a remaining portion of the rows. A given data word is stored in each of a row in the write-bypass portion and another row in the main memory portion during a data write operation in response to word-write signals and bit-write signals associated with each of the respective plurality of contiguous columns. The circuit also includes a control logic configured to store data associated with storage locations of the given data word in each of the row in the write-bypass portion and the other row in the main memory portion to facilitate access of the given data word during a data read operation.

20 Claims, 4 Drawing Sheets

MEMORY CIRCUIT WITH WRITE-BYPASS PORTION

TECHNICAL FIELD

This disclosure relates generally to classical and quantum computing systems, and more specifically to a memory circuit with a write-bypass portion.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One example includes a memory circuit. The memory circuit includes a memory array in which contiguous rows of the memory array are organized as a write-bypass portion that comprises a first portion of the rows and a main memory portion that includes a remaining portion of the rows. A given data word is stored in each of a row in the write-bypass portion and another row in the main memory portion during a data write operation in response to word-write signals and bit-write signals associated with each of the respective plurality of contiguous columns. The circuit also includes a control logic configured to store data associated with storage locations of the given data word in each of the row in the write-bypass portion and the other row in the main memory portion to facilitate access of the given data word during a data read operation.

Another example includes a method for writing a data word to a memory circuit. The method includes determining a first storage location of the data word in a first row associated with a memory array. The first row can be associated with a write-bypass portion that comprises a first portion of a plurality of contiguous rows of the memory array. The method also includes determining a second storage location of the data word in a second row associated with the memory array. The second row can be associated with a main memory portion that comprises a second portion of the plurality of contiguous rows of the memory array. The method also includes storing the first and second storage locations to facilitate access of the data word during a subsequent data read operation. The method also includes providing a first word-write signal to the first row associated with the write-bypass portion and providing a second word-write signal to the second row associated with the main memory portion. The method further includes providing a plurality of bit-write signals to each of a respective plurality of contiguous columns to write the data word into each of the first row and the second row based on the plurality of bit-write signals sequentially propagating in order through the write-bypass portion and through the main memory portion.

Another example includes a memory circuit. The memory circuit includes a memory array comprising a plurality of contiguous rows and a plurality of contiguous columns of memory cells. The plurality of contiguous rows of the memory array are organized as a write-bypass portion that comprises a first portion of the plurality of contiguous rows and a main memory portion that includes a remaining portion of the plurality of contiguous rows. The write-bypass portion of the memory array is arranged more proximal to peripheral circuitry than the main memory portion. A given data word is stored in each of a row in the write-bypass portion and another row in the main memory portion during a data write operation in response to a plurality of word-write signals and a plurality of bit-write signals generated via the peripheral circuitry and which are associated with the respective plurality of contiguous columns. The circuit also includes a control logic configured to store data associated with storage locations of the given data word in each of the row in the write-bypass portion and the other row in the main memory portion to facilitate access of the given data word during a data read operation.

DETAILED DESCRIPTION

This disclosure relates generally to classical and quantum computing systems, and more specifically to a memory circuit with a write-bypass portion. The memory circuit includes an array of memory cells arranged in contiguous rows and columns. The rows of the memory circuit are arranged as a write-bypass portion that includes a first portion of the contiguous rows and a main memory portion that includes a second portion of the contiguous rows. The rows of the memory array are each configured to store a data word during a data-write operation in response to a word-write signal that selects the respective row for writing and a plurality of bit-write signals that are configured to sequentially propagate through the rows from peripheral circuitry, with each of the bit-write signals being associated with a respective column of the memory array. During a data-write operation, a given data word is stored in each of a first row in the write-bypass portion and a second row in the main memory portion in response to respective word-write signals and the bit-write signals.

As an example, each of the word-write and bit-write signals can be provided as single-flux quantum (SFQ) pulse signals or reciprocal quantum logic (RQL) pulses signals. Therefore, the bit-write signals are configured to propagate from one row of the memory array to a next row of the memory array via a Josephson transmission line (JTL). Such a propagation of the bit-write signals from a first row to a last row can thus take time, which can result in delays in accessing data from the rows in the array that are farther from the first row. Thus, the write-bypass portion of the rows can be arranged most proximal to the peripheral circuitry that generates the bit-write signals, and can thus store a copy of the data word that is also written to the main memory portion. As a result, data can be accessed during a bit-read operation in a much more rapid manner from the write-bypass portion, which can result in a much more time-efficient data access from the memory array than requiring a time delay to access the data word based on a worst-case-scenario of the data word being stored in the last row of the memory array.

Figure 1:
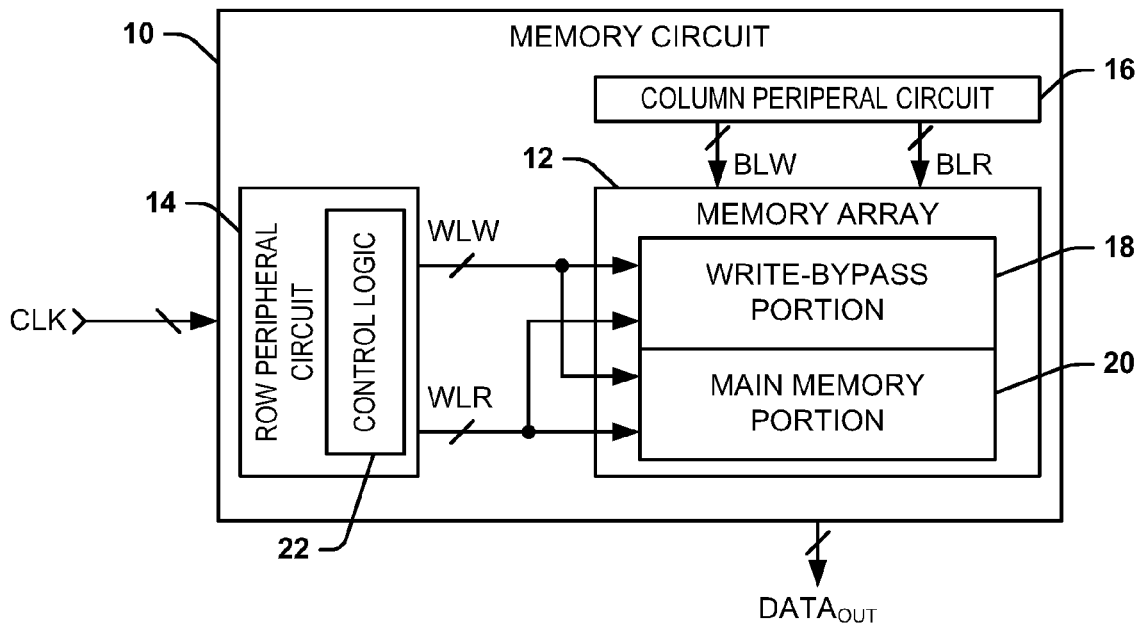
FIG. 1 illustrates an example of a memory circuit.

FIG. 1 illustrates an example of a memory circuit 10. The memory circuit 10 can be implemented in any of a variety of computer systems, such as a quantum computer system. For example, the memory circuit 10 can be implemented in a reciprocal quantum logic (RQL) computer system.

The memory circuit 10 includes a memory array 12 that includes memory cells that are arranged in an array of rows and columns. Each of the rows of the memory array 12 is configured to store a data word during a data-write operation in response to a word-write signal WLW that is generated from a row peripheral circuit 14 and selects the respective row for writing, and a plurality of bit-write signals BLW that are generated from a column peripheral circuit 16 and are each associated with a respective column of the memory array 12 to sequentially propagate through the rows from the column peripheral circuit 16. The data that is stored in the memory array 12 can be accessed during a data-read operation in response to a word-read signal WLR that is generated from the row peripheral circuit 14 and selects the respective row for reading, and a plurality of bit-read signals BLR that are generated from the column peripheral circuit 16. Accordingly, a data word that is read from a respective row of the memory array 12 that is selected via a word-read signal WLR can be provided as an output data $DATA_{OUT}$ in response to the bit-read signals BLR. As an example, the output data $DATA_{OUT}$ can correspond to the set of bit-read signals BLR in either a voltage state or a non-voltage state, as described in greater detail herein.

As described herein, the memory array 12 is configured as a single contiguous arrangement of rows and columns. In the example of FIG. 1, the memory array 12 includes a write-bypass portion 18 and a main memory portion 20. Each of the write-bypass portion 18 and the main memory portion 20 correspond to groups of rows of the contiguous memory array 12. As an example, the write-bypass portion 18 can correspond to first rows of the memory array 12 that are arranged most proximal to the column peripheral circuit 16 that generates the bit-write signals BLW, and the main memory portion 20 can correspond to the remaining portion of rows of the memory array 12 most distal from the column peripheral circuit 16. Therefore, based on the memory array 12 being arranged as a single contiguous arrangement of connected rows and columns, the write-bypass portion 18 and the main memory portion 20 are merely separate designations of the rows of the memory array 12, as described in greater detail herein.

As an example, the memory circuit 10 can be implemented as a phase transmission line (PTL) memory system, such that each of the memory cells of the memory array 12 can be configured as PTL memory cells. The memory circuit 10 can thus be implemented in a superconducting computer system, in which the write signals can be provided as quantum pulses. For example, the word-write signals WLW and the bit-write signals BLW can be provided as single-flux quantum (SFQ) pulses or as reciprocal quantum logic (RQL) pulses based on a clock signal CLK. Therefore, the word-write signals WLW can propagate from the row peripheral circuit 14 to a first memory cell, and from one memory cell to a next memory cell in a given row of the memory array 12, and thus from one column to a next column, via a Josephson transmission line (JTL). Similarly, the bit-write signals BLW can propagate from the column peripheral circuit 16 to a first memory cell, and from one memory cell to a next memory cell in a given column of the memory array 12, and thus from one row to a next row, via a JTL.

Based on the memory circuit 10 implementing quantum pulses for the word-write signals WLW and for the bit-write signals BLW for performing a write operation, there is a propagation delay for writing a given data word to a respective row in the memory array 12, with the propagation delay being increasingly greater for the rows of the memory array 12 that are farthest away in the sequence of propagation of the quantum pulses that correspond to the bit-write signals BLW, and thus farthest away from the column peripheral circuit 16. As a result, the propagation delay provides a minimum delay time in which data can be accessed from the memory array 12 during the data read operation via a word-read signal WLR and the bit-read signals BLR. Therefore, because the write-bypass portion 18 is arranged as the first contiguous rows of the memory array 12 that are arranged most proximal to the column peripheral circuit 16, data words that are stored in the write-bypass portion 18 can be accessed sooner than data words that are stored in the main memory portion 20 based on the propagation delay.

As a result, during a data write operation, the memory circuit 10 can be configured to write each data word that is to be stored in the memory array 12 as a first copy in a respective row of the write-bypass portion 18 (e.g., via a first word-write signal WLW associated with a respective first row) and as a second copy in a respective row of the main memory portion 20 (e.g., via a second word-write signal WLW associated with a respective second row). Therefore, the second copy of the data word that is written in the respective row of the main memory portion 20 can correspond to a nominal storage of the data word, such that the data word is stored in the main memory portion 20 indefinitely (e.g., until intentionally overwritten). However, the first copy of the data word that is written in the respective row of the write-bypass portion 18 can correspond to a temporary storage of the data word, and can be much more rapidly accessible than the second copy of the data that is written in the main memory portion 20. For example, the rapid accessibility can be during the data write operation, such that the data word can be accessed from the write-bypass portion 18 in a data read operation during the data write operation while the bit-write signals BLW are propagating through the main memory portion 20. Accordingly, the first copy of the data word can be more rapidly accessible from the write-bypass portion 18 during a data read operation than the second copy of the data word that is written in the main memory portion 20, thus providing faster data access than typical memory systems that require a delay in memory access until the propagation delay is completely expired to account for a worst-case scenario of a data write to a last row of the memory array 12.

In the example of FIG. 1, the row peripheral circuit 14 includes a control logic 22. As an example, the control logic 22 can be configured as a content addressable memory (CAM). The control logic 22 is configured to store data associated with the addresses of each data word that is stored in the memory array 12, including data associated with the addresses of each data word that is stored in the write-bypass portion 18. For example, the control logic 22 can dictate a location in the write-bypass portion 18 in which a given data word is to be stored (in addition to storage in the main memory portion 20). As an example, the control logic 22 can be configured to sequentially cycle through each row of the write-bypass portion 18 via respective word-write signals WLW to provide a row in the write-bypass portion 18 in which a given data word is to be written, and thus overwriting a previous data word that was stored in the respective row of the write-bypass portion 18. In this manner, the data words that are stored in the write-bypass portion 18 are stored temporarily, such that the data words are only stored for as long as it takes for the control logic 22 to sequentially cycle through all of the rows in the write-bypass portion 18 in a wrap-around manner in each successive data read operation to arrive at the respective data row once again to overwrite the currently stored data word.

As an example, the write-bypass portion 18 can have a number of rows that is selected based on the number of rows in the entirety of the memory array 12. For example, the number of rows of the write-bypass portion 18 can be such that the control logic 22 does not overwrite a given row of the write-bypass portion 18 based on the control logic 22 sequentially cycling through all of the rows in the write-bypass portion 18 in the wrap-around manner through the entirety of a data write operation, and thus a worst-case propagation time of the bit-write signals BLW through the memory array 12. As a result, the write-bypass portion 18 can have a number of rows that is suitable to ensure that a given one of the rows can be accessed in a data read operation before the conclusion of a data write operation, and thus before being overwritten.

Additionally, during a data read operation, the control logic 22 can provide an indication of a row in the write-bypass portion 18 in which a given data word is stored, such that the data word can be accessed during a data read operation in a much quicker manner than having to wait until a worst-case scenario of propagation delay through the entire memory array 12 to access the same data word (i.e., the second copy of the data word) from the main memory portion 20. Accordingly, the control logic 22 can cooperate with the write-bypass portion 18 of the memory array 12 to provide more rapid access of data from the memory array 12 than typical memory arrays that likewise have propagating bit-write signals and require a worst-case scenario propagation delay in accessing data.

Figure 2:
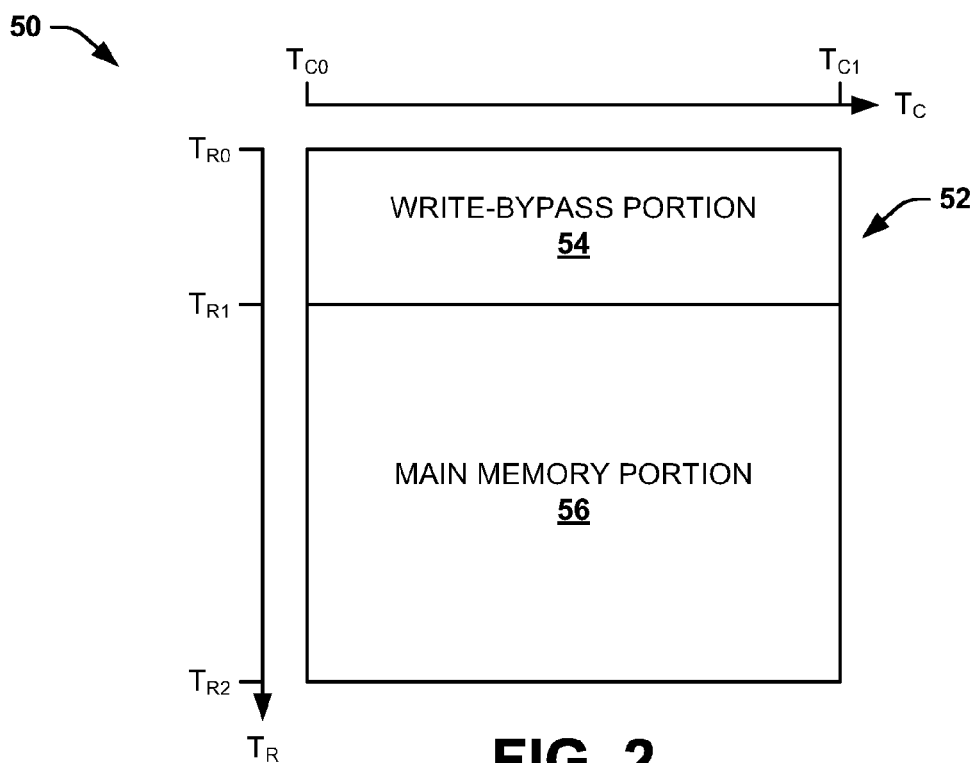
FIG. 2 illustrates an example diagram of timing associated with a memory array.

FIG. 2 illustrates an example diagram 50 of timing associated with a memory array 52. The memory array 52 includes a write-bypass portion 54 and a main memory portion 56. The memory array 52 can correspond to the memory array 12 in the example of FIG. 1, such that the write-bypass portion 54 can likewise correspond to the write-bypass portion 18 and the main memory portion 56 can correspond to the main memory portion 20. Therefore, the memory array 52 can be configured as a single contiguous arrangement of rows and columns, such that the write-bypass portion 54 can correspond to first contiguous rows of the memory array 52 that are arranged most proximal to a column peripheral circuit (e.g., the column peripheral circuit 16) that generates bit-write signals, and the main memory portion 56 can correspond to the remaining contiguous portion of rows of the memory array 52.

The diagram 50 demonstrates two time scales associated with a data write operation, demonstrated as a first time scale $T_R$ and a second time scale $T_C$. The first time scale $T_R$ corresponds to a propagation time associated with the bit-write signals BLW, and the second time scale $T_C$ corresponds to a propagation time associated with the word-write signals WLW. The first time scale $T_R$ thus corresponds to the bit-write signals BLW that are generated from a column peripheral circuit 16 sequentially propagating through the rows of the memory array 52. Similarly, the second time scale $T_C$ thus corresponds to the word-write signals WLW that are generated from a row peripheral circuit 14 sequentially propagating through the columns of the memory array 52. For example, the bit-write signals BLW and the word-write signals WLW can propagate based on fluxons (i.e., single-flux quantum) pulses propagating along Josephson transmission lines (JTLs) in a quantum computing environment, such as based on the clock signal CLK.

As an example, the bit-write signals BLW and the word-write signals WLW can be provided in a cascade manner from one column to the next and from one row to the next, respectively. For example, for each memory cell in a given row of the memory array 52 to which data is written, a given bit-write signal BLW and a given word-write signal WLW intersect at the respective memory cell at approximately the same time. Therefore, a given one of the bit-write signals BLW propagates to a row of the memory array 52 that is one row behind the preceding bit-write signal BLW associated with the previous column (e.g. immediately left) in the sequence corresponding to the column that is closest to the row peripheral circuit 14. Similarly, a given one of the word-write signals WLW propagates to a column of the memory array 52 that is one column behind the preceding word-write signal WLW associated with the previous row (e.g. immediately above) in the sequence corresponding to the row that is closest to the column peripheral circuit 16. Accordingly, as a word-write signal WLW propagates along a respective row of the memory array 52, it intersects with a respective bit-write signal BLW at each memory cell in the row.

In the example of FIG. 2, the diagram 50 demonstrates a first time $T_{R0}$ in the first time scale $T_R$ that corresponds to initialization of a write operation, in which a given bit-write signal BLW is provided from the column peripheral circuit 16 and propagates to the first row of the memory array 52, with the first row corresponding to a first row of the write-bypass portion 54. The diagram 50 also demonstrates a first time $T_{C0}$ in the second time scale $T_C$ that corresponds to a word-write signal WLW being provided from the row peripheral circuit 14 and propagating to a first column of the memory array 52 in response to the bit-write signals BLW propagating to the respective row. Therefore, in response to the bit-write signals BLW propagating to each respective row, a respective word-write signal WLW propagates from a first column, at approximately the time $T_{C0}$, to a last column at approximately a time $T_{C1}$.

Figure 3:
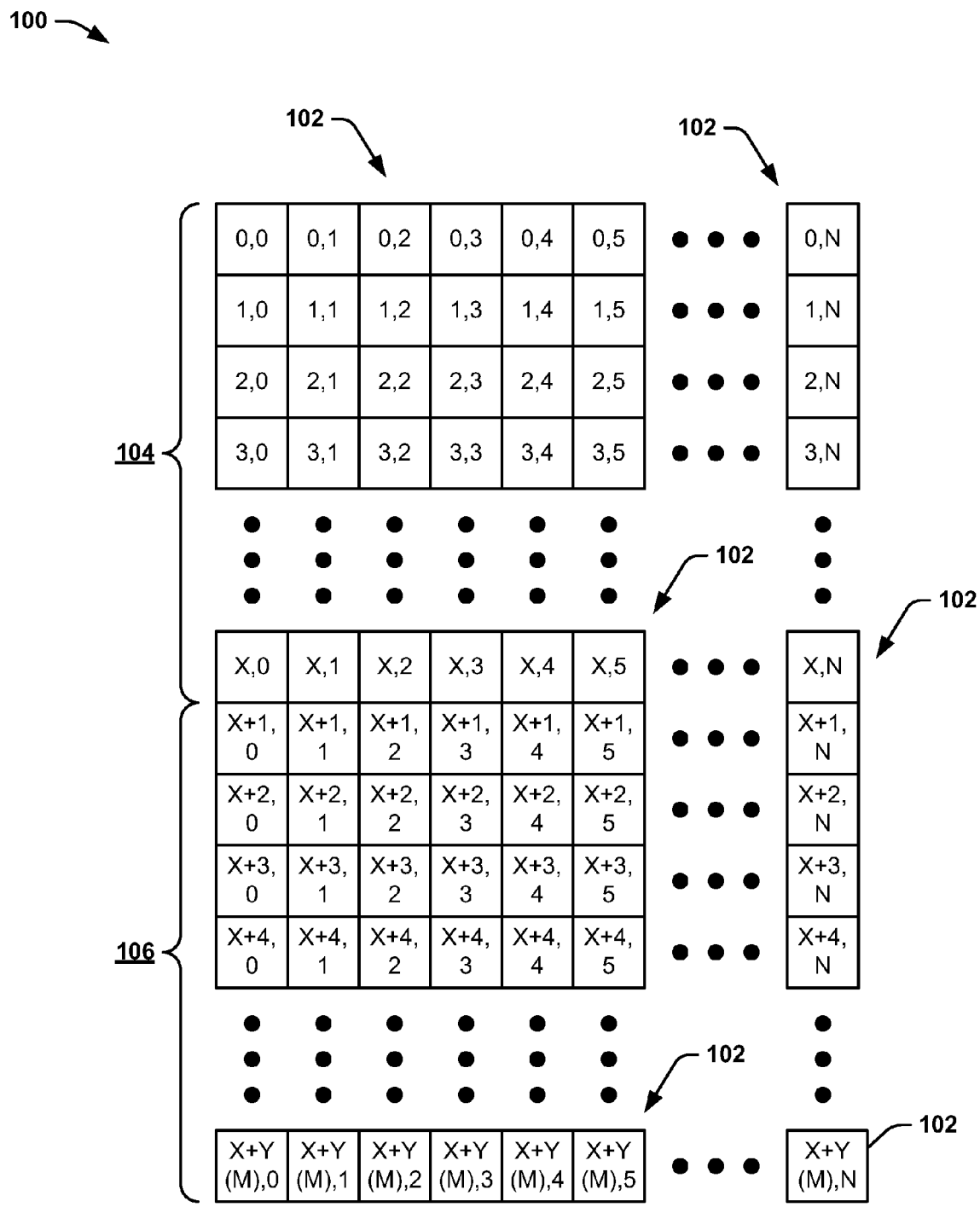
FIG. 3 illustrates an example of a memory array.

As described previously, the memory array 52 can be configured as a single contiguous arrangement of rows and columns, such that the write-bypass portion 54 can correspond to rows of the memory array 52 that are arranged most proximal to the column peripheral circuit and the main memory portion 56 can correspond to the remaining portion of rows of the memory array 52. As an example, the write-bypass portion 54 and the main memory portion 56 can each correspond to portions of the memory array 52 that are arranged as contiguous rows. FIG. 3 illustrates an example of a memory array 100. The memory array 100 can correspond to the memory array 12 in the example of FIG. 1 or the memory array 52 in the example of FIG. 2. The memory array 100 demonstrates an array of M rows and N columns of memory cells 102. As an example, the memory cells 102 can correspond to PTL memory cells, as described in greater detail herein.

The memory array 100 is demonstrated in the example of FIG. 3 as being configured as a single contiguous arrangement of the M rows and N columns, such that each memory cell 102 is demonstrated as having a designation of "ROW, COLUMN", where "ROW" ranges from 0 to M and "COLUMN" ranges from 0 to N. The memory array 100 includes two groupings of the rows of the memory cells 102 that include a write-bypass portion 104 and a main memory portion 106. In the example of FIG. 3, the write-bypass portion 104 is demonstrated as including a first X of the contiguous rows of the memory cells 102, and the main memory portion 106 includes a subsequent Y of the contiguous rows of the memory cells 102. Therefore, the quantity M of rows is equal to X+Y, as demonstrated in a last row of the memory cells 102. As an example, Y can be greater than X, such that the main memory portion 106 can include a significantly larger quantity of rows than the write-bypass portion 104.

As an example, the contiguous arrangement of the rows that constitute the write-bypass portion 104 and the main memory portion 106 can be such that all of the rows in the memory array 100 can be configured substantially identically. Therefore, a given row in the write-bypass portion 104 can be substantially identical to a given row in the main memory portion 106. Furthermore, the transition from the Xth row to the X+1th, and thus the transition from the write-bypass portion 104 to the main memory portion 106 can be substantially the same as any transition from one row to the next in either write-bypass portion 104 to the main memory portion 106. Accordingly, the transition from the write-bypass portion 104 to the main memory portion 106 can be substantially arbitrary, and is not defined by any hardware difference in the configuration of the memory cells 102. Thus, the write-bypass portion 104 and the main memory portion 106 each correspond to portions of memory cells 102 of the memory array 100 that is configured as a contiguous arrangement of rows of memory cells 102.

Referring back to the example of FIG. 2, the diagram 50 also includes a time $T_{R1}$ in the first time scale $T_R$. The time $T_{R1}$ corresponds to a time at which the bit-write signals BLW have propagated through the rows of the write-bypass portion 54 and begin to propagate through the rows of the main memory portion 56. Thus, at the time $T_{R1}$, the bit-write signals BLW have propagated from the Xth row to the X+1th row in the example of FIG. 3, and thus the first row of the main memory portion 56. Therefore, the bit-write signals BLW continue to propagate through the main memory portion 56 from the X+1th row to the Mth row (i.e., the X+Yth row) in the example of FIG. 3 at a time $T_{R2}$. Upon conclusion of the time $T_{C1}$ in the second time scale $T_C$ after conclusion of the time $T_{R2}$ in the first time scale $T_R$, the data write operation is concluded, as all of the bit-write signals BLW and the word-write signal WLW of the last row of the memory array 52 are done propagating.

Therefore, the data write operation has a total propagation delay of $T_{R2}+T_{C1}$. In a typical memory circuit that implements bit-write and word-write signals that propagate from row-to-row and column-to-column, respectively, data cannot be read from the memory array until the data write operation has expired, and thus the entirety of the propagation delay duration has expired, based on requiring a wait time in the worst-case scenario of the data to be accessed having been written into the last row of the memory array, and thus the last row through which the bit-write signals propagate. However, as described previously in the example of FIG. 1, each data word is written into the memory array 52 as a first copy in the write-bypass portion 54 (e.g., via a first word-write signal WLW associated with a respective first row) and a second copy in the main memory portion 56 (e.g., via a first word-write signal WLW associated with a respective first row). Accordingly, the data word can be accessed from the write-bypass portion 54 at any time after the expiration of the time $T_{R1}+T_{C1}$, and thus at any time after all of the bit-write signals BLW have propagated through the write-bypass portion 54. Thus, the data word can be accessed from the write-bypass portion 54 even during the data write operation while the bit-write signals BLW are propagating through the main memory portion 56. As a result, the data word can be accessed after a propagation delay of only $T_{R1}+T_{C1}$, as opposed to the much greater propagation delay of $T_{R2}+T_{C1}$. Accordingly, in the example of the main memory portion 56 having a greater number of rows than the write-bypass portion 54, the propagation delay for performing a data read operation from the write-bypass portion 54 can be significantly less than 50% of the propagation delay time of a typical memory array that requires a propagation delay to account for the worst-case scenario of the data word being written into the last row of the memory array, which would be $T_{R2}+T_{C1}$ for the memory array 52. Therefore, the memory circuit 10 can provide significantly faster data access than typical memory circuits.

Figure 4:
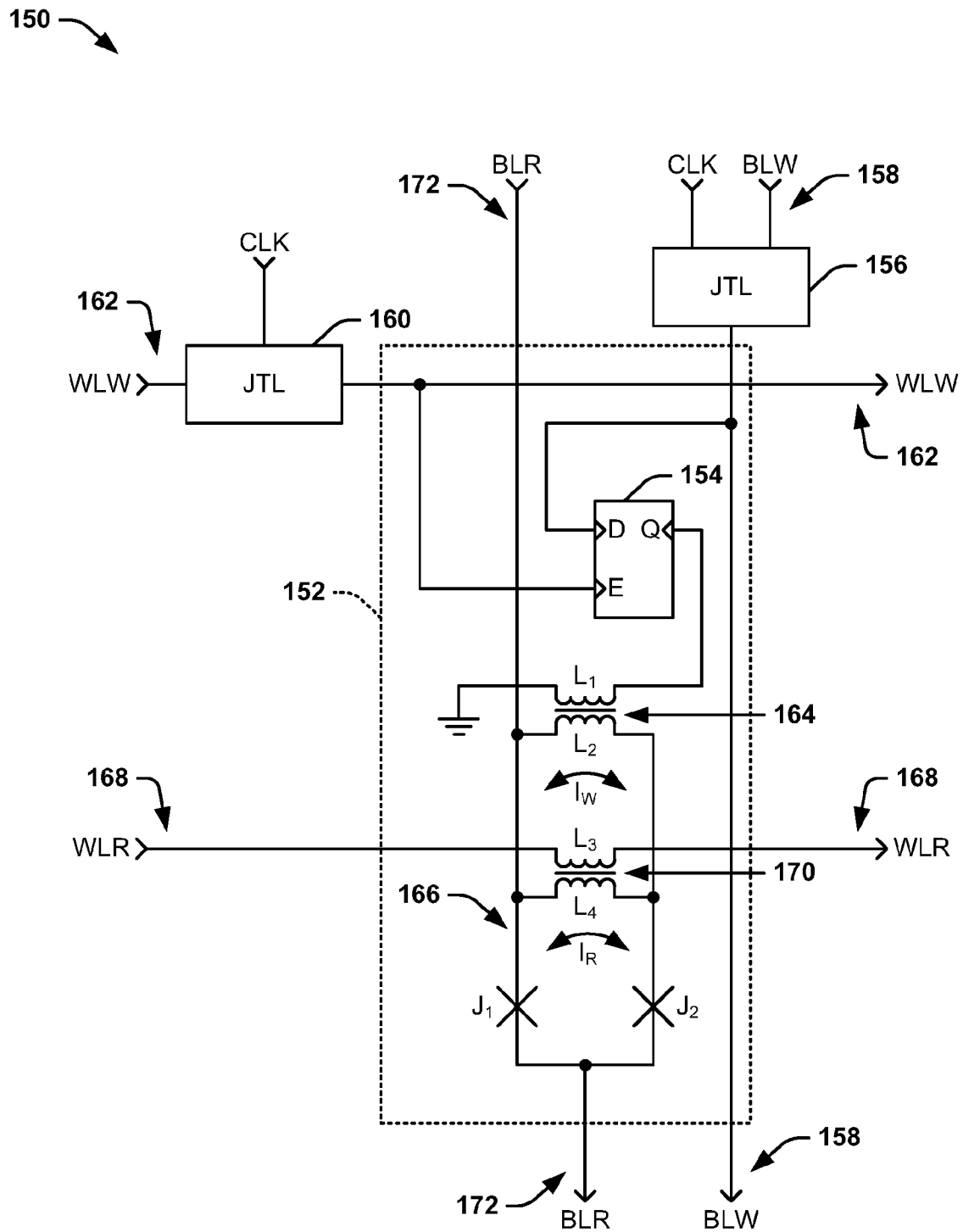
FIG. 4 illustrates an example of a memory cell.

FIG. 4 illustrates an example of a memory cell system 150. The memory cell system 150 can correspond to a memory cell in any of the memory arrays 12, 52, or 100 in the examples of FIG. 1, 2, or 3, respectively. Therefore, reference is to be made to the examples of FIGS. 1-3 in the following description of the example of FIG. 4.

The memory cell system 150 includes a memory cell 152 that is configured to store a logic state corresponding to either a logic-0 or a logic-1. The memory cell 152 includes a D-latch 154 that is configured to receive a bit-write signal BLW, provided from a JTL 156 coupled to a bit-write line 158, at a D-input, and to receive a word-write signal WLW, provided from a JTL 160 coupled to a word-write line 162, at an enable input. The JTLs 156 and 160 can thus correspond to a manner in which SFQ pulses corresponding to the bit-write signals BLW and the word-write signals WLW can propagate via a clock signal CLK (e.g., a quadrature clock signal CLK in an RQL system) from row-to-row and column-to-column, respectively, as described in the examples of FIGS. 1-3. Thus, in response to the bit-write signal BLW being provided at a first logic state (e.g., logic-0) corresponding to no SFQ pulse, the D-latch 154 will provide a logic-0 output at the Q-output in response to the word-write signal WLW being provided as an SFQ pulse corresponding to selection of the row in which the memory cell 152 is included for writing during the data write operation. However, in response to the bit-write signal BLW being provided at a second logic state (e.g., logic-1) corresponding to an SFQ pulse, the D-latch 154 will provide a logic-1 output at the Q-output in response to the word-write signal WLW being provided as an SFQ pulse.

The output from the D-latch 154 is provided through a primary inductor $L_1$ of a transformer 164. The transformer 164 also includes a secondary inductor $L_2$ that is provided in a loop of a superconducting quantum interference device (SQUID) 166 that also includes a pair of Josephson junctions $J_1$ and $J_2$. Therefore, in response to the Q-output of the D-latch 154 providing a logic-1 output, the logic-1 output is provided as an induced current $I_W$ (e.g., the induced current $I_W$ is greater than 0) via the transformer 164 to the SQUID 166 to provide a bias current to the Josephson junctions $J_1$ and $J_2$. Alternatively, in response to the Q-output of the D-latch 154 providing a logic-0 output, the no current (e.g., the induced current $I_W$ is approximately equal to 0) is induced via the transformer 164 to the SQUID 166, and thus the Josephson junctions $J_1$ and $J_2$ are unbiased. Accordingly, the D-latch 154 can store the logic state of the memory cell 152 based on the latched state, and thus can provide a bias or no bias to the Josephson junctions $J_1$ and $J_2$ in the SQUID 166 based on the logic state.

During a data read operation, a word-read signal WLR can be provided on a word-read line 168 through a primary inductor $L_3$ of a transformer 170. Therefore, the word-read signal WLR can be induced as a current via a secondary inductor L4 of the transformer 170. The secondary inductor $L_4$ is arranged in parallel with the secondary inductor L2 of the transformer 164, and is thus part of the SQUID 166. Therefore, the word-read signal WLR is induced as a current in the SQUID 166, demonstrated in the example of FIG. 4 as a current $I_R$. Additionally, the memory cell system 150 includes a bit-read line 172 that is coupled to the SQUID 166. Therefore, the bit-read line 172 can be indicative of the stored logic-state of the memory cell 152 during the data read operation in response to the induced current $I_R$ via the word-read signal WLR.

For example, in response to the Q-output being provided as a logic-0, and thus no current being induced into the SQUID 166, the induced current $I_R$ alone (e.g., with the induced current $I_W$ being approximately equal to 0) can have an insufficient magnitude to trigger the Josephson junctions $J_1$ and $J_2$. As a result, the bit-read line 172 can provide a bit-read signal BLR having an approximately zero voltage, and can thus indicate a stored logic-state of a logic-0. However, in response to the Q-output being provided as a logic-1, and thus a current being induced into the SQUID 166, the combination of the induced current $I_R$ and the induced current $I_W$ can have a sufficient magnitude to trigger the Josephson junctions $J_1$ and $J_2$. As a result, the Josephson junctions $J_1$ and $J_2$ can enter a voltage state (e.g., alternately triggering) to provide a voltage on the bit-read line 172, and thus providing the bit-read signal BLR having a positive voltage indicative a stored logic-state of a logic-1.

While the memory arrays 12, 52, or 100 are described as including PTL memory cells, such as the memory cell system 150 in the example of FIG. 4, it is to be understood that the memory arrays 12, 52, or 100 are not limited to the use of PTL memory cells. As an example, other types of memory cells can be implemented, such as operating based on bit-write and word-write signals that propagate from row-to-row and column-to-column, respectively. Accordingly, the PTL memory cell system 150 demonstrated in the example of FIG. 4 is provided as one example of a type of memory cell that can be implemented in the memory arrays 12, 52, or 100.

Figure 5:
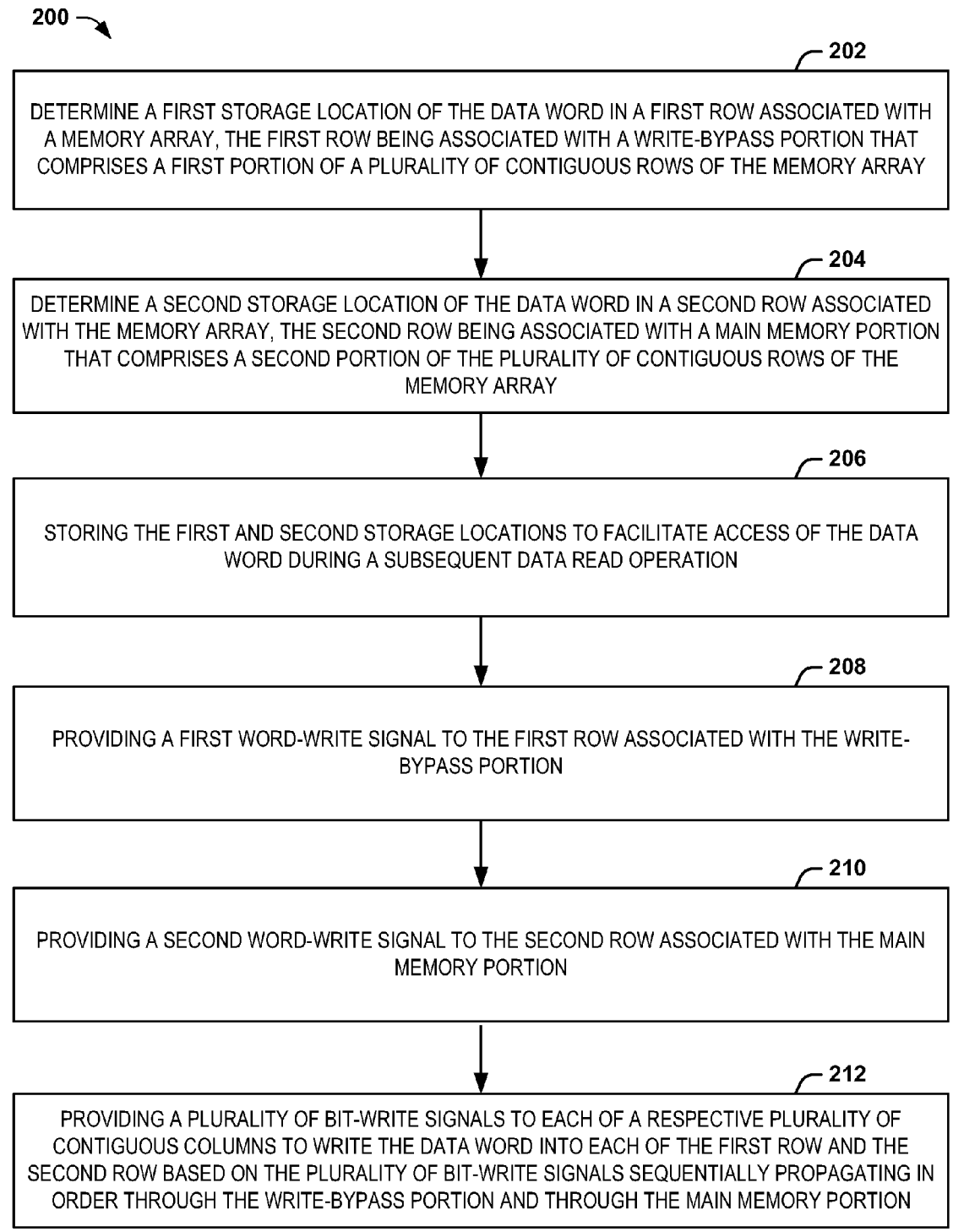
FIG. 5 illustrates an example of a method for writing data to a memory circuit.

In view of the foregoing structural and functional features described above, a method in accordance with various aspects of the present disclosure will be better appreciated with reference to FIG. 5. While, for purposes of simplicity of explanation, the method of FIG. 5 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure.

FIG. 5 illustrates a method 200 for writing a data word to a memory circuit (e.g., the memory circuit 10). At 202, a first storage location of the data word in a first row associated with a memory array (e.g., the memory array 12) is determined. The first row can be associated with a write-bypass portion (e.g., the write-bypass portion 18) that comprises a first portion of a plurality of contiguous rows of the memory array. At 204, a second storage location of the data word in a second row associated with the memory array. The second row can be associated with a main memory portion (e.g., the main memory portion 20) that comprises a second portion of the plurality of contiguous rows of the memory array. At 206, the first and second storage locations are stored (e.g., in the control logic 22) to facilitate access of the data word during a subsequent data read operation. At 208, a first word-write signal (e.g., a first word-write signal WLW) is provided to the first row associated with the write-bypass portion. At 210, a second word-write signal is provided to the second row associated with the main memory portion. At 212, a plurality of bit-write signals (e.g., the bit-write signals BLW) are provided to each of a respective plurality of contiguous columns to write a given data word into each of the first row and the second row based on the plurality of bit-write signals sequentially propagating in order through the write-bypass portion and through the main memory portion.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A memory circuit comprising:
   a memory array comprising a plurality of contiguous rows and a plurality of contiguous columns of memory cells, the plurality of contiguous rows of the memory array being organized as a write-bypass portion that comprises a first portion of the plurality of contiguous rows and a main memory portion that includes a remaining portion of the plurality of contiguous rows, wherein a given data word is stored in each of a row in the write-bypass portion and another row in the main memory portion during a data write operation in response to a plurality of word-write signals and a plurality of bit-write signals associated with each of the respective plurality of contiguous columns; and
   a control logic configured to store data associated with storage locations of the given data word in each of the row in the write-bypass portion and the other row in the main memory portion to facilitate access of the given data word during a data read operation.

2. The circuit of claim 1, wherein the plurality of bit-write signals are configured to sequentially propagate in order through the write-bypass portion and through the main memory portion.

3. The circuit of claim 1, wherein the plurality of bit-write signals are generated via peripheral circuitry, and wherein the write-bypass portion of the memory array is arranged more proximal to the peripheral circuitry than the main memory portion.

4. The circuit of claim 1, wherein during a data read operation, the control logic is configured to dictate whether the given data word is to be read from the row in the write-bypass portion or the other row in the main memory portion based on an elapsed time between the data write operation and the data read operation.

5. The circuit of claim 1, wherein the row in the write-bypass portion corresponds to a next sequential row of the first portion of the plurality of contiguous rows corresponding to the write-bypass portion in a wrap-around sequential manner.

6. The circuit of claim 5, wherein the given data word overwrites a previous data word stored in the row in the write-bypass portion.

7. The circuit of claim 1, wherein the plurality of bit-write signals are configured as single flux quantum (SFQ)-pulse signals that propagate from one of the plurality of contiguous rows to a next of the plurality of contiguous rows via a Josephson transmission line (JTL).

8. The circuit of claim 7, wherein the SFQ-pulse signals are as reciprocal quantum logic (RQL) signals based on an RQL clock signal.

9. The circuit of claim 1, wherein each of the memory cells is configured as a phase-transmission line (PTL) memory cell, such that the memory read operation is performed based on word-read signals and bit-read signals that are provided as signals on respective phase transmission lines.

10. A method for writing a data word to a memory circuit, the method comprising:
    determining a first storage location of the data word in a first row associated with a memory array, the first row being associated with a write-bypass portion that comprises a first portion of a plurality of contiguous rows of the memory array;
    determining a second storage location of the data word in a second row associated with the memory array, the second row being associated with a main memory portion that comprises a second portion of the plurality of contiguous rows of the memory array;
    storing the first and second storage locations to facilitate access of the data word during a subsequent data read operation;
    providing a first word-write signal to the first row associated with the write-bypass portion;
    providing a second word-write signal to the second row associated with the main memory portion; and
    providing a plurality of bit-write signals to each of a respective plurality of contiguous columns to write the data word into each of the first row and the second row based on the plurality of bit-write signals sequentially propagating in order through the write-bypass portion and through the main memory portion.

11. The method of claim 10, wherein determining the first storage location comprises selecting a next sequential row of the first portion of the plurality of contiguous rows corresponding to the write-bypass portion in a wrap-around sequential manner.

12. The method of claim 11, wherein providing the plurality of bit-write signals comprises overwriting a previous data word stored in the first row in the write-bypass portion.

13. The method of claim 10, wherein providing the plurality of bit-write signals comprises providing the plurality of bit-write signals as single flux quantum (SFQ)-pulse signals that propagate from one of the plurality of contiguous rows to a next of the plurality of contiguous rows via a Josephson transmission line (JTL).

14. The method of claim 10, wherein providing the plurality of bit-write signals comprises providing the plurality of bit-write signals as reciprocal quantum logic (RQL) signals that propagate from one of the plurality of contiguous rows to a next of the plurality of contiguous rows via a Josephson transmission line (JTL) in response to an RQL clock signal.

15. A memory circuit comprising:
    a memory array comprising a plurality of contiguous rows and a plurality of contiguous columns of memory cells, the plurality of contiguous rows of the memory array being organized as a write-bypass portion that comprises a first portion of the plurality of contiguous rows and a main memory portion that includes a remaining portion of the plurality of contiguous rows, wherein the write-bypass portion of the memory array is arranged more proximal to peripheral circuitry than the main memory portion, wherein a given data word is stored in each of a row in the write-bypass portion and another row in the main memory portion during a data write operation in response to a plurality of word-write signals and a plurality of bit-write signals generated via the peripheral circuitry and which are associated with the respective plurality of contiguous columns; and
    a control logic configured to store data associated with storage locations of the given data word in each of the row in the write-bypass portion and the other row in the main memory portion to facilitate access of the given data word during a data read operation.

16. The circuit of claim 15, wherein the plurality of bit-write signals are configured to sequentially propagate in order through the write-bypass portion and through the main memory portion.

17. The circuit of claim 15, wherein during a data read operation, the content-addressable memory is configured to dictate whether the given data word is to be read from the row in the write-bypass portion or the other row in the main memory portion based on an elapsed time between the data write operation and the data read operation.

18. The circuit of claim 15, wherein the row in the write-bypass portion corresponds to a next sequential row of the first portion of the plurality of contiguous rows corresponding to the write-bypass portion in a wrap-around sequential manner, wherein the given data word overwrites a previous data word stored in the row in the write-bypass portion.

19. The circuit of claim 15, wherein the plurality of bit-write signals are configured as reciprocal quantum logic (RQL) signals that propagate from one of the plurality of contiguous rows to a next of the plurality of contiguous rows via a Josephson transmission line (JTL) in response to an RQL clock signal.

20. The circuit of claim 15, wherein each of the memory cells is configured as a phase-transmission line (PTL) memory cell, such that the memory read operation is performed based on word-read signals and bit-read signals that are provided as signals on respective phase transmission lines.

* * * * *